United States Patent [19]

Morton et al.

[11] Patent Number: 4,943,948
[45] Date of Patent: Jul. 24, 1990

[54] PROGRAM CHECK FOR A NON-VOLATILE MEMORY

[75] Inventors: Bruce L. Morton, Round Rock; Bruce E. Engles, Austin; Michael H. Chaddock, Round Rock, all of Tex.

[73] Assignee: Motorola, Inc., Schaumburg, Ill.

[21] Appl. No.: 871,214

[22] Filed: Jun. 5, 1986

[51] Int. Cl.⁵ .................................................. G11C 7/00
[52] U.S. Cl. .................................... 365/201; 365/185; 365/104
[58] Field of Search ................... 371/21; 365/201, 104, 365/94, 103, 184, 185

[56] References Cited

U.S. PATENT DOCUMENTS

| | | | |
|---|---|---|---|
| 3,656,106 | 4/1972 | Stein | 365/201 X |
| 4,458,338 | 7/1984 | Giebel et al. | 365/201 |
| 4,612,630 | 9/1986 | Rosier | 371/21 X |
| 4,625,311 | 11/1986 | Fitzpatrick et al. | 371/21 X |
| 4,631,724 | 12/1986 | Shimizu | 371/21 |

Primary Examiner—Stuart N. Hecker
Assistant Examiner—Alyssa H. Bowler
Attorney, Agent, or Firm—James L. Clingan, Jr.

[57] ABSTRACT

A non-volatile memory has memory cells which are programmable to a programmed state from an unprogrammed state. Programming changes the conductivity of the memory cell which is being programmed. The particular state of a selected memory cell is determined by comparing the conductivity of the selected memory cell to that of a normal reference. In order to assure that a memory cell has been programmed to a conductivity which is sufficient for reliable detection, a substitute reference with a different conductivity is used immediately after programming. If the selected cell is detected as being programmed when compared to the substitute reference, the selected cell is then determined to have been sufficiently programmed for reliable detection using the normal reference.

5 Claims, 4 Drawing Sheets

PROGRAM CHECK FOR A NON-VOLATILE MEMORY

FIELD OF THE INVENTION

The present invention relates to non-volatile memories, and more particularly, to techniques for ensuring that a non-volatile memory cell has been sufficiently programmed.

BACKGROUND OF THE INVENTION

Non-volatile memories include memories which retain data even when the power supply is turned off. Typical memories in this category are various read only memories (ROMs), such as mask programmable ROMs, erasable programmable ROMs (EPROMs), and electrically erasable read only memories (EEPROMs). These memories typically have memory cells which are either in a high conductivity or low conductivity state.

In the case of EPROMs and EEPROMs, the memory cells have either a relatively high threshold voltage or a relatively low threshold voltage which is used to obtain the high and low conductivity states. In the case of EPROMs, the high conductivity state is the unprogrammed or erased state. The threshold voltage is increased by application of a programming voltage. In the case of EEPROMs, the erased state is the low conductivity state. An EEPROM is programmed to a low threshold voltage by application of a programming voltage which removes electrons from a floating gate which in turn causes a higher conductivity. In either the EPROM or EEPROM case, the determination of the logic state of a cell is made by determining on which side of some predetermined conductivity the cell conductivity is. If a cell is on one side of a certain conductivity, it is programmed. If it is on the other side of this conductivity, it is unprogrammed or erased. In the case of EPROMs, the programmed side is toward lower conductivity. In the case of EEPROMs, the programmed side is toward higher conductivity.

Particularly in EPROMs but also applicable to EEPROMs, is the desirability of overprogramming to ensure that there is sufficient distinction between the high and low conductivity states for reliable detection. A technique which has been used in EPROMs is to apply a programming voltage for some predetermined duration. This duration is now typically between 100 and 500 microseconds. After application of the programming voltage, the cell which has been selected for programming is then read. If the cell is then detected as being in the programmed state, some predetermined number of applications of the programming voltage are applied to obtain overprogramming. This predetermined number of extra applications can either be a set number or it can be a function of the number of applications required to first reach the programmed state. In either case, there is an assumption that the extra applications actually did result in additional electrons being transferred in or out of the floating gate and consequently, increasing the margin between the programmed state and the unprogrammed state. This does not, however, ensure the degree to which there is a margin.

SUMMARY OF THE INVENTION

An object of the present invention is to provide an improved non-volatile memory.

Another object of the invention is to provide a non-volatile memory with improved programming.

Yet another object of the invention is to provide an improved technique for ensuring that non-volatile memory cells have been sufficiently programmed.

These and other objects are achieved in a memory which has an array of non-volatile memory cells which are in either a programmed or an erased state. A memory cell in the programmed state has a conductivity on one side of a first conductivity and a memory cell in the erased state has a conductivity on the other side of the first conductivity. The memory has a sense amplifier for determining if a selected cell is in the programmed or erased state by comparing the conductivity of the selected cell to a reference having a conductivity of a first magnitude and for alternatively determining if the selected cell has been programmed to said one side of a second conductivity. Said second conductivity is on said one side of said first conductivity.

DESCRIPTION OF THE INVENTION

Figure 1:
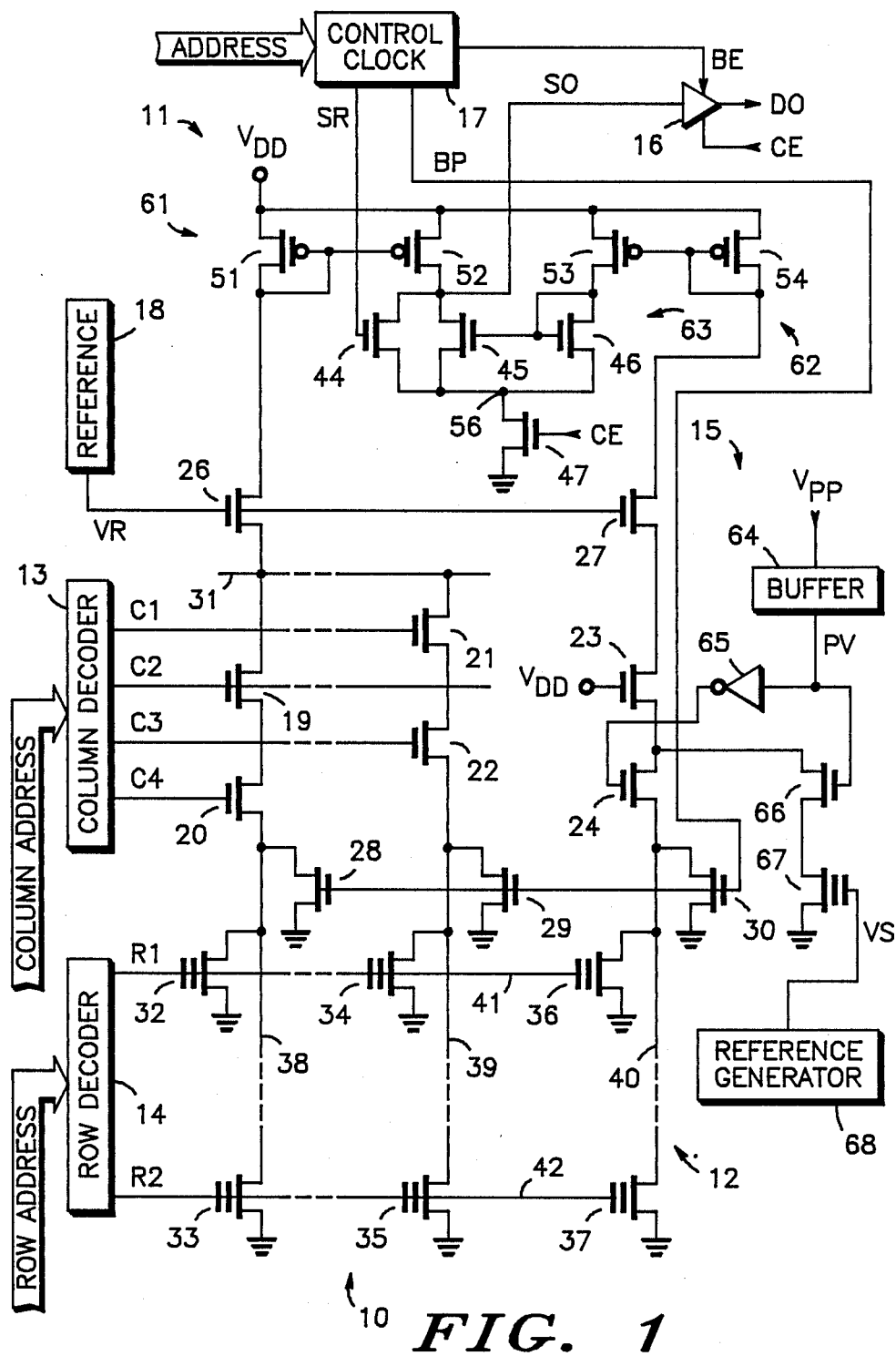
FIG. 1 is a combination of a block diagram and circuit diagram of a memory according to a preferred embodiment of the invention.

Shown in FIG. 1 is a memory 10 comprised generally of a sense amplifier 11, a memory array 12, a column decoder 13, a row decoder 14, a reference substitution circuit 15, an output buffer 16, a control clock 17, reference voltage generator 18, coupling transistors 19, 20, 21, 22, 23, 24, 26, and 27, bit line precharge transistors 28, 29, 30, and a data line 31. Transistors 19-24 and 26-30 are N channel transistors. Memory 10 has both N and P channel transistors for controlling array 12. The N channel transistors have a threshold voltage between 0.5 and 0.8 volt. The P channel transistors have a threshold voltage of between −0.6 and −1.0 volt. Array 12 is comprised of floating gate transistors which are either in a low or high threshold state. The floating gate transistors shown in FIG. 1 comprising array 12 are transistors 32, 33, 34, 35, 36, and 37; bit lines 38 39, and 40; and word lines 41 and 42. Floating gate transistors are EPROM cells which are erased to the low threshold voltage state by the application of ultra-violet light and are electrically programmed to the high threshold state by application of a programming voltage. This is conventional for EPROM cells. Sense amplifier 11 is comprised of N channel transistors 44, 45, 46 and 47 and P channel transistors 51, 52, 53, and 54.

Column decoder 13 provides a plurality of outputs for selecting which bit line will provide data to data line 31. Column decoder 13, as determined by a column address coupled to column decoder 13, causes two of these outputs to become active in order to implement the bit selection. The outputs shown in FIG. 1 are signals C1, C2, C3, and C4. Transistor 19 has a drain connected to data line 31, a gate for receiving signal C2 from column decoder 13, and a source. Transistor 20 has a drain connected to the source of transistor 19, a gate for receiving signal C4 from column decoder 13, and a source connected to bit line 38. Transistor 21 has a drain connected to data line 31, a gate for receiving a signal C1 from column decoder 13, and a source. Transistor 22 has a drain connected to the source of transistor 21, a gate for receiving signal C3 from column decoder 13, and a source connected to bit line 39. When bit line 38 is selected by the column address, column decoder 13 drives signals C2 and C4 active at a logic high so that transistors 19 and 20 couple bit line 38 to data line 31. When bit line 39 is selected by the column address, column decoder 13 drives signals C1 and C3 active at a logic high so that transistors 21 and 22 couple bit line 39 to data line 31.

Reference substitution circuit 15 comprises a buffer 64, an inverter 65, an N channel transistor 66, a floating gate transistor 67, and a reference generator 68. Buffer 64 receives a signal VPP and provides a program verify signal PV. When signal VPP is an N channel threshold voltage plus the magnitude of a P channel threshold voltage above VDD, buffer 64 provides signal PV at a logic high and otherwise at a logic low. Signal VPP is a relatively high voltage signal used for programming. The use of signal VPP for programming is conventional. Buffer 64, however, is used to detect the presence of VPP and provide signal PV at logic levels between VDD and ground. Such generation of a logic signal from VPP is also conventional. The particular use of signal PV described herein, however, is not conventional. Signal PV is used to determine between two conductivities used for a reference for sense amplifier 11. Inverter 65 has an input for receiving signal PV from buffer 64, and an output. Reference generator 68 has an output which provides reference voltage VS. Transistor 67 has a source connected to ground, a gate for receiving reference VS, and a drain. Transistor 66 has a gate for receiving signal PV, a source connected to the drain of transistor 67, a drain.

Transistors 23 and 24 are used to simulate transistor coupling pairs 19–20 and 21–22. Transistor 23 has a gate connected to a positive power supply terminal VDD for receiving a positive power supply voltage such as 5 volts, a source connected to the drain of transistor 66, and a drain. Transistor 24 has a drain connected to the source of transistor 23, a gate connected to the output of inverter 65, and a drain connected to bit line 40. When signal PV is a logic high, transistor 66 couples reference transistor 67 to the source of transistor 23. When signal PV is a logic low, transistor 24 couples bit line 40 to the source of transistor 23.

Reference voltage generator 18 has an output which provides a reference voltage VR at about 2.1 volts. Voltage VR is used to limit the voltage on a selected bit line such as one of bit lines 38 and 39. Voltage VR limits bit line voltage via data line 31. The voltage is limited on data line 31 via transistor 26. Transistor 26 has a drain connected to a data input of sense amplifier 11, a gate for receiving voltage VR from reference voltage generator 18, and a source connected to data line 31. The voltage on data line 31 is thus limited to voltage VR of about 2.1 volts minus the threshold voltage of transistor 26. This threshold voltage including body effect, which is well known in the art, will be nominally 0.9 volt. Consequently, the voltage on data line 31 will be limited to about 2.1 minus 0.9 which equals 1.2 volt. With data line 31 limited in voltage a selected bit line is also so limited. Transistor 27 is used to match the affect of transistor 26. Transistor 27 has a drain connected to a reference input of sense amplifier 11, a gate for receiving voltage VR from generator 18, and a source connected to the drain of transistor 23. Transistor 27 limits the voltage on the drain of transistor 23 in the safe way that transistor 26 limits the voltage on data line 31. With the drain of transistor 23 limited in voltage, bit line 40 is limited in voltage in the same way as a selected bit line is limited in voltage.

Transistors 28–30 are used to precharge bit lines 38–40 to a voltage near ground potential in response to a bit line precharge signal BP generated by control clock 17. Transistors 28, 29, and 30 each have a gate for receiving signal BP from clock 17, a source connected to ground, and a drain. The drains of transistors 28, 29, and 30 are connected to bit lines 38, 39, and 40, respectively. When clock 17 drives signal BP active to a logic high, transistors 28–30 precharge bit lines 38–40 by discharging bit lines 38–40 well below the voltage to which bit lines 38–40 are limited by voltage VR and transistors 26 and 27.

Transistors 32–37 are programmed to either a high threshold voltage or a low threshold voltage. The low threshold state is the erased state obtained after exposure to ultra-violet light. Programming of array 12 is achieved by selectively raising the threshold voltage of the floating gate transistors which comprise array 12 such as transistors 32–35. Transistors 36 and 37 are used as references and are in the erased state only. There is a reference transistor at the end of each word line. Whether the reference transistor at the end of an enabled word line is coupled to sense amplifier 11 via transistors 24, 23, and 27 or reference transistor 67 is coupled to sense amplifier 11 via transistors 66, 23, and 27 is determined by the logic state of signal PV generated by buffer 64. Transistor 32 has a drain connected to bit line 38, a gate connected to word line 41, and a source connected to ground. Transistor 33 has a drain connected to bit line 38, a gate connected to word line 42, and a source connected to ground. Transistor 34 has a drain connected to bit line 39, a gate connected to word line 41, and a source connected to ground. Transistor 35 has a drain connected to bit line 39, a gate connected to word line 42, and a source connected to ground. Transistor 36 has a drain connected to bit line 40, a gate connected to word line 41, and a source connected to ground. Transistor 37 has a drain connected to bit line 40 a gate connected to word line 42, and a source connected to ground. Row decoder 14 has a plurality of row decoder output signals for enabling a word line as selected by a row address received by row decoder 14. In response to the row address, row decoder 14 causes one of these row decoder output signals to become active. This type of row decoder is well known in the art. Row decoder output signals R1 and R2 are shown as being outputs of row decoder 14. Row decoder 14 outputs signal R1 onto word line 41 and signal R2 onto word line 42. A word line is enabled when the row decoder output signal corresponding thereto is active at a logic high. Because memory 10 is implemented in CMOS, the logic high provided to activate a word line is at VDD. Word line 41 is enabled when row decoder 14 provides signal R1 at a logic high. Word line 42 is enabled when row decoder 14 provides signal R2 at a logic high. When word line 41 is enabled, transistors 32, 34, and 36 are activated in accordance with the threshold voltage to which they are programmed. It is desirable that the high threshold voltage be above VDD so that the memory cell transistor having been programmed to the high voltage state will be completely non-conductive when the word line to which it is connected is enabled. The low voltage state is desirably well below the voltage of an enabled word line so that a memory cell transistor having the low voltage state will be highly conductive when the word line to which it is connected is enabled.

In practice, however, the high threshold voltage may not exceed VDD. A memory cell transistor which is programmed to the high voltage state may in fact be conductive when the word line is enabled. The high and low threshold voltage states must then be distinguished on the basis of relative degree of conductivity rather than simply distinguishing between memory cells which are conductive or non-conductive. Bit line 40 and and the memory cells connected thereto are used as a reference for emulating an unprogrammed cell. Sense amplifier 11 compares the conductivity of its reference input to that of its data input to determine if the selected memory cell which is coupled to the data input is in the low or high threshold state. Sense amplifier 11 provides a sense amplifier output signal SO at a logic high when the selected memory cell is in the low threshold state which is the relatively higher conductivity state. Signal SO is provided at a logic low when the selected memory cell is in the high threshold voltage state which is the relatively lower conductivity state. Buffer 16 has an input for receiving signal SO and an output for providing data output signal DO. Buffer 16 receives a chip enable signal CE and a buffer enable signal BE. The chip enable signal CE is derived from an externally generated signal *CE which enables memory 10 at a logic low and disables memory 10 at a logic high. This operation of memory 10 in response to signal *CE is conventional. Signal CE is complementary to signal *CE. Amplifier 16 is enabled when signal CE is a logic high and disabled when signal CE is a logic low. Buffer 16 is clocked by a buffer enable signal BE received from clock 17. When signal BE is active, buffer 16 provides signal DO responsive to the logic state of signal SO. When signal BE is inactive, buffer 16 is inactive and provides signal DO as a high impedance. A buffer with this high impedance feature is commonly known as a tri-state buffer. Clock 17 includes a timing feature so that signal BE is provided in the active state just when sense amplifier 11 provides signal SO as a valid indication of the program state of the selected memory cell. Buffer 16 has a comparatively large drive capability which causes it to draw significant current when it changes state. Signal BE is used to hold buffer 16 in a predetermined state, tri-stated, until signal SO is indicative of the logic state of the accessed memory cell. This prevents any portion of the actual sensing operation from being disturbed by switching transients or by noise coupled into array 12 which occurs when buffer 16 switches logic states.

Transistor 51 has a drain and a gate, which act as the data input of sense amplifier 11, connected to the drain of transistor 26, and a source connected to VDD. Transistor 54 has a drain and a gate, which act as the reference input of sense amplifier 11, connected to the drain of transistor 27, and a source connected to VDD. Transistor 52 has a source connected to VDD, a gate connected to the drain and gate of transistor 51, and a drain as the output of sense amplifier 11. Transistor 44 has a drain connected to the drain of transistor 52, a gate for receiving a sense amplifier reset signal SR from clock 17, and a source connected to a node 56. Sense amplifier 11 is reset by signal SR becoming active at a logic high which causes signal SO to be a logic low. Node 56 is clamped to ground by transistor 47 during the operation of sense amplifier 11. Transistor 47 has a drain connected to node 56, a gate for receiving a chip enable signal CE. Sense amplifier 11 is enabled by chip enable signal CE being active. When signal CE signal is active, transistor 47 clamps node 56 to ground. Signal CE is dervied from and complementary to a signal *CE which is the chip enable signal provided externally to memory 10. When signal CE is active, it indicates that memory 10 is to respond to the addresses it receives to either perform a read or a write. Thus, for operational purposes, node 56 can be viewed as ground. Transistor 45 has a drain connected to the drain of transistor 52, a source connected to node 56, and a gate. Transistor 46 as a source connected to node 56, and a drain and a gate connected to the gate of transistor 45. Transistor 53 has a drain connected to the gate and drain of transistor 46, a source connected to VDD, and a gate connected to the gate and drain of transistor 54.

Sense amplifier 11 is initialized for a new sensing operation when signal SR becomes active which resets signal SO to a logic low. Signal SR is active as a logic high pulse of 45-85 nanoseconds (ns) in duration. This duration of signal SR at a logic high varies with process variations. Signal SR becomes active in response to an address transition or in response to signal CE becoming inactive. When an address has changed, a new bit line and/or a new word line is selected. In response to the address transition, signal BP is also activated as a logic high pulse of about 10 ns. duration. This precharges the bit lines including bit line 38 below the voltage limit of about 1.2 volt supplied by signal VR via transistor 26. Assume that transistor 32 is the newly selected memory cell which is selected by row decoder 14 selecting word line 41 and column decoder 13 selecting bit line 38. Word line 41 is enabled and bit line 38 is coupled to data line 31 Transistors 32 and 36 accordingly receive logic high inputs on their gates. Also so assume that transistor 32 is in the erased or low threshold state which is the relatively high conductivity state. Transistor 36, as a reference cell, is also in the low threshold state. All of the transistors in array 12 are closely matched. Consequently, transistors 32 and 36 have very nearly the same conductivity.

Current is supplied from transistor 51 to bit line 38. This current is determined by the conductivity of transistor 32 and the voltage limiting affect of signal VR. Transistor 54 similarly supplies current to bit line 40. The current supplied via transistor 54 to bit line 40 is determined by the conductivity of transistor 36 and the voltage limiting affect of signal VR. With bit lines 38 and 40 at the same voltage and transistors 32 and 36 having the same conductivity, the currents through transistors 51 and 54 are the same. Transistors 51 and 54 are both forced into the saturation region of operation due to the gate to drain connection. The saturation region of operation is characterized as being that region of operation in which the current through the transistor is limited by the gate to source voltage and can increase only slightly with increase: in the magnitude of the drain to source voltage.

Transistors 52 and 53 form current mirrors with transistors 51 and 54. Transistors 51 and 52 form a current mirror 61 in which transistor 51 is the master and transistor 52 is the slave. Transistors 53 and 54 form a current mirror 62 in which transistor 54 is the master and transistor 53 is the slave. The gains and thresholds of transistors 53 and 54 are matched to be the same. The actual values of the gains and thresholds of transistors are difficult to keep constant over process variations which are likely to occur. The relative gains and thresholds of the same transistor types, however, are quite constant with process variations if care is taken in the layout of the transistors. The capability of maintaining relative gains and thresholds is known in the art. Consequently, the gains and thresholds of transistors 53 and 54 can be relied upon to be the same. The current flowing through transistor 54 is thus reflected to transistor 53 in a one to one ratio. In a current mirror configuration the master is forced into the saturation region, and the slave has the same gate to source voltage as the master so that the current flowing through the slave will be a proportion of the current flowing through the master as determined by the gain ratios of the master and the slave so long as there is not some other mechanism operating to limit the current below that established by the gain ratios. Transistors 46 and 47 are in series with transistor 53 but are of sufficient gain to not cause current limiting through transistor 53. The current through transistor 53 is very close to the current flowing through transistor 54. Transistor 46 has the same current as transistor 53 and therefore the same as transistor 54. Transistors 45 and 46 form a current mirror 63 in which transistor 46 is the master and transistor 45 is the slave. Transistor 45 is chosen to have the same gain as transistor 46 so that transistor 45 is limited to carrying no more than the current flowing through transistor 54.

Figure 2:
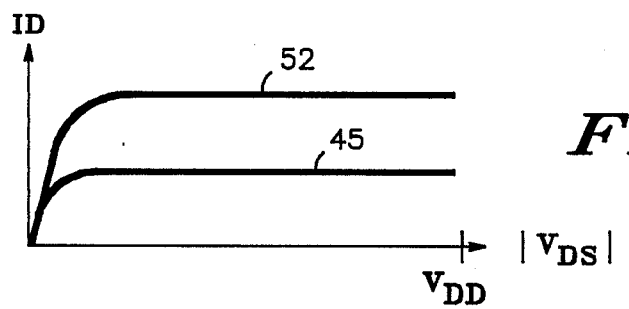
FIG. 2 is graph of a transistor characteristic useful in understanding the memory of FIG. 1.
Figure 3:
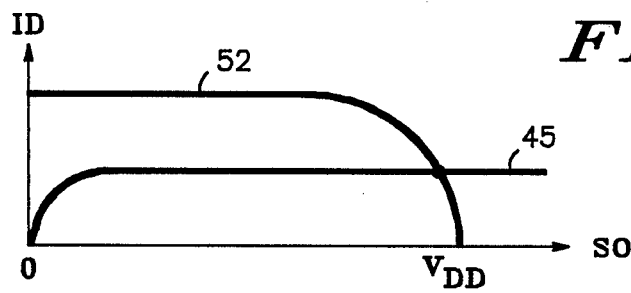
FIG. 3 is graph of a transistor characteristic useful in understanding the memory of FIG. 1.

Transistor 52 is chosen to have a gain twice that of transistor 51 so that the current carrying capability of transistor 52 is twice that of the current flowing through transistor 51. A convenient technique to obtain double gain is to fabricate two identical transistors in parallel. This also is convenient for obtaining a matching threshold voltage. In the case of selecting an unprogrammed memory cell, the current flowing through transistors 51 and 54 is virtually the same. This results in transistor 52 having twice the current carrying capability of transistor 45. In such case transistor 45 is in the saturation region, but transistor 52 is in the triode region. Shown in FIG. 2 is the drain current versus the magnitude of the drain to source voltage (VDS) curves for transistors 52 and 45 for this described situation in which the current carrying capability of transistor 52 is twice that of transistor 45. FIG. 3 shows the same information as FIG. 2 except that instead of drain current being plotted against the magnitude of VDS, drain current is plotted against drain to source voltage as represented by the voltage of signal SO. The intersection of the curves is the voltage at which signal SO will be as a result of transistor 52 having twice the current carrying capability of transistor 45. The resulting voltage of signal SO is very near VDD as shown in FIG. 3. Buffer 16 thus easily recognizes signal SO as a logic high for the case in which a selected memory cell is in the low threshold state.

For the case in which the selected memory cell, transistor 32 in the present example, is in the high threshold voltage state, the conductivity of the selected memory cell is much less than the selected reference cell, reference cell 36 in the present example. The current through transistor 32 as in selected memory cell is determined by the voltage on bit line 38 and the conductivity of transistor 32. With the conductivity substantially reduced for the high threshold state and the bit line voltage the same, the current is substantially reduced in comparison to the low threshold voltage state. Typically, the conductivity of transistor 32 will be at least 10 times less for the high threshold voltage state than for the low threshold voltage state. Sense amplifier 11, however, is effective even if the conductivity ratio of low threshold voltage to high threshold voltage is much less than 10. Assume for example a ratio of four to one between logic states so that the current drawn from transistor 51 by transistor 32 is one fourth of that drawn from transistor 54 by transistor 36. The current carrying capability of transistor 45 is equal to the current flowing through transistor 54. Because, in this example, the current flowing through transistor 54 is four times that flowing through transistor 51, the current carrying capability of transistor 45 is four times the current flowing through transistor 51. The current carrying capability of transistor 52 is equal to twice the current flowing through transistor 51. Therefore, the current carrying capability of transistor 45 is twice that of transistor 52.

Figure 4:
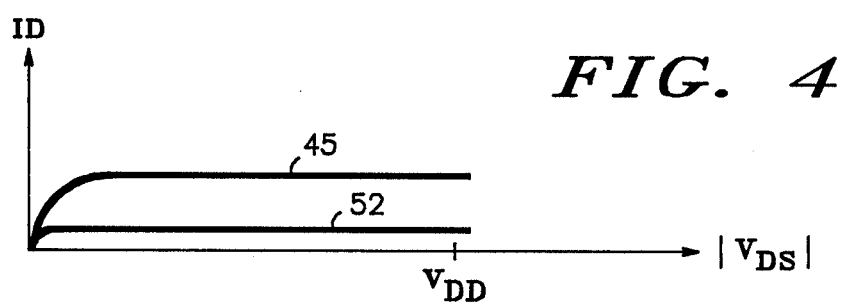
FIG. 4 is graph of a transistor characteristic useful in understanding the memory of FIG. 1.
Figure 5:
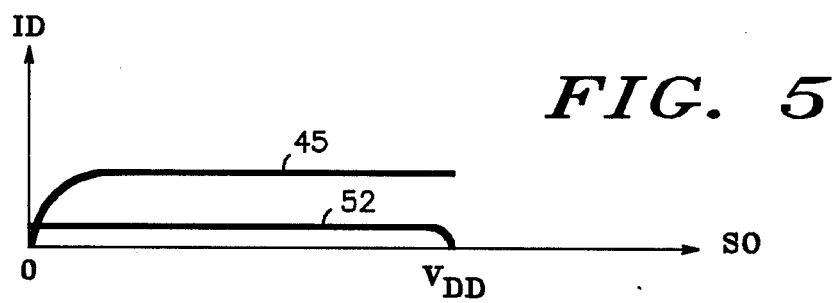
FIG. 5 is graph of a transistor characteristic useful in understanding the memory of FIG. 1.

Shown in FIG. 4 are the drain current versus the magnitude of the drain to source voltage curves for this condition in which the current carrying capability of transistor 45 is twice that of transistor 52. The same information is shown in FIG. 5 except that instead of the magnitude of the drain to source voltage being plotted versus drain current, the voltage of signal SO is plotted versus drain current. The intersection of the two curves in FIG. 5 is the resulting voltage of signal SO. As shown in FIG. 5 the resulting voltage of signal SO is very near zero or ground potential. This voltage is easily recognizable by inverter 15 as a logic low which thus causes buffer 16 to provide signal DO as a logic high for the case in which the selected memory cell is programmed to the high threshold voltage state.

When the current carrying capability of transistor 52 is twice as great as that of transistor 45, sense amplifier 11 provides signal SO at a voltage easily recognizable as a logic high. When the current carrying capability of transistor 45 is twice as great as that of transistor 52, sense amplifier 11 provides signal SO at a voltage easily recognizable as a logic low. Transistors 54, 53, and 46 act to limit the current carrying capability of transistor 45 in relation to the conductance of a selected reference memory cell. Transistor 51 acts to limit the current carrying capability of transistor 52 in relation to the conductance of the selected memory cell. Transistor 54 establishes a reference current therethrough which is related to the conductivity of a reference cell. Transistors 46, 53, and 54 cause transistor 45 to be current limited to the reference current. The conductivity of the reference cell is made to be virtually the same as the conductivity of a memory cell in the low voltage state because the reference cell is made the same as a memory cell and is left in the unprogrammed state which is the low voltage state. Transistor 51 establishes a current therethrough representative of the logic state of a selected memory cell. When the logic state of the selected memory cell is the same as the reference cell, the current through transistor 51 causes the current carrying capability of transistor 52 to be significantly greater than the current carrying capability of transistor 45.

When the logic state of the selected memory cell is different than that of the reference cell, the current through transistor 51 causes the current carrying capability of transistor 52 to be significantly less than the current carrying capability of transistor 45.

In the case in which a memory cell such as memory cell 32 has been programmed to a point at which its conductivity is half that of an unprogrammed state, it is indeterminate as to what sense amplifier 11 will provide. The unprogrammed reference cell, such as cell 36 will draw twice the current of cell 32. This current is reflected to transistor 45 by biasing transistor 45 to current carrying capability equal to the current flowing in cell 36. Because of the two to one ratio between transistors 51 and 52, transistor 52 is biased by the current flowing through cell 32 to a current carrying capability equal to twice that flowing through cell 32. Consequently, transistors 52 and 45 are biased to the same current carrying capability so that it is not clear whether the input to buffer 16 would be recognized as a logic high or a logic low. A conductivity half that of the reference is the point which decides between whether a cell is interpreted as programmed or unprogrammed. The reference for normal reading is at a conductivity equal to that of a cell which has been completely erased and the floating gate of which does not have a net accumulation or depletion of electrons. If a selected cell is on the more conductive side of this half conductivity point, it is interpreted as unprogrammed. If a selected cell is on the less conductive side of this half conductivity point, it is interpreted as being programmed.

To ensure that a cell has been programmed well beyond this half conductivity point, another reference is substituted for the reference cells at the end of word lines R1 and R2. After a programming voltage has been applied to a selected cell such as cell 32, cell 32 is read to determine if in fact it has been programmed. The programming voltage comprises applying about 12 volts to the gate of the selected memory cell and about 8.5 volts to the drain with the source grounded. This induces a drain to source current from which electrons are pulled to the floating gate of the memory cell. This is a well known technique for programming an EPROM cell. For EEPROM memory cells, the more common technique is to program a memory cell by removing electrons from the floating gate. After a programming voltage has been applied for some predetermined duration for either EPROMs or EEPROMs, the programmed cell is checked to ensure that it has been programmed. In memory 10 this is desirably done by holding signal VPP high while reading the logic state of the cell which has just been programmed. Signal VPP is the high voltage used for programming. Buffer 64 detects the presence of signal VPP at a high voltage. Signal VPP, when present, is nominally 12.5 volts. Signal VPP is considered present, however, any time it is an N channel threshold voltage plus the magnitude of a P channel threshold voltage above VDD. When signal VPP is present, buffer 64 provides signal PV at a logic high which causes transistor 66 to become conductive and inverter 65 to provide a logic low output. The logic low output of inverter 65 causes transistor 24 to become non-conductive. Transistor 24 being non-conductive has the effect of decoupling reference cells 36 and 37 from sense amplifier 11. Transistor 66 becoming conductive has the effect of coupling floating gate reference transistor 67 to sense amplifier 11. Reference transistor 67 is biased by a signal VS to a current carrying capability of one fifth that of a memory cell in the erased state. Transistor 67 could also be used for the regular one half conductivity detection as well as for the overprogramming detection. The regular one half conductivity detection would be achieved by applying the word line voltage to transistor 67, whereas the overprogramming detection would be achieved by application of signal VS. The two desired conductivities for the reference could thus be selected by switching between two different devices or by switching between two different conductivities of the same device. This would remove the need for the reference transistors, such as transistors 36 and 37 at the end of word lines but might reduce the ability to bias the reference at the same voltage as that of the word line.

For a memory cell such as memory cell 32 to be sensed by sense amplifier 11 as being in the programmed state, it must have a conductivity less than one half that of the reference coupled to sense amplifier 11. With reference transistor 67 being coupled to sense amplifier 11 as the reference, the reference has a conductivity characterized as one fifth that of an unprogrammed memory cell. Consequently, in order for sense amplifier 11 to indicate that a selected memory cell is programmed, that selected cell must have a conductivity less than one tenth that of an unprogrammed cell. By using this technique to check for sufficient programming margin, the programmer can be assured of having a ten to one conductivity margin between programmed and unprogrammed cells. This ten to one margin constitutes an order of a magnitude difference which is good margin for reliable detection.

In the particular embodiment described, a cell is considered to be programmed when its conductivity has been driven to less than a first predetermined conductivity. This predetermined conductivity is one half that of a cell which is not programmed at all. A selected cell is thus determined to be programmed if the conductivity of it is to the less conductivity side of the predetermined conductivity. To ensure that overprogramming has occurred a second predetermined conductivity is used. A selected cell is determined to be sufficiently overprogrammed if it is of a less conductive than the second predetermined conductivity. The second predetermined conductivity is to the less conductivity side of the first predetermined conductivity. To implement this procedure, the sense amplifier uses a reference which is of a conductivity of a first magnitude or of a second magnitude. When the first magnitude is chosen, the first predetermined conductivity is the standard for determining if a cell is programmed or unprogrammed. When the second magnitude is chosen, the second predetermined conductivity is the standard for determining if a cell has or has not been sufficiently overprogrammed. The same principle can apply for the case in which programming causes a cell to become more conductive, such as is typical in EEPROMs. In such case the second predetermined conductivity would be to the more conductive side of the first predetermined conductivity instead of to the less conductive side as in the case of memory 10. This is because in the case of an EEPROM, a cell would be considered programmed when it was more conductive than the first predetermined conductivity, the first predetermined conductivity being that which is used to distinguish between programmed and unprogrammed.

In general, there is a first standard for determining if a cell is programmed or unprogrammed. There is a second standard for determining if a cell has or has not been sufficiently overprogrammed. If a programmed cell is on the less conductive side of the first standard, the second standard is also on the less conductive side of the first standard. This is the case for EPROM memory 10 of FIG. 1. If on the other hand a programmed cell is on the more conductive side of the first standard as would be the likely case for an EEPROM, then the second standard would also be on the more conductive side of the first standard. The second standard and a programmed cell should be on the same side of the first standard.

Figure 6:
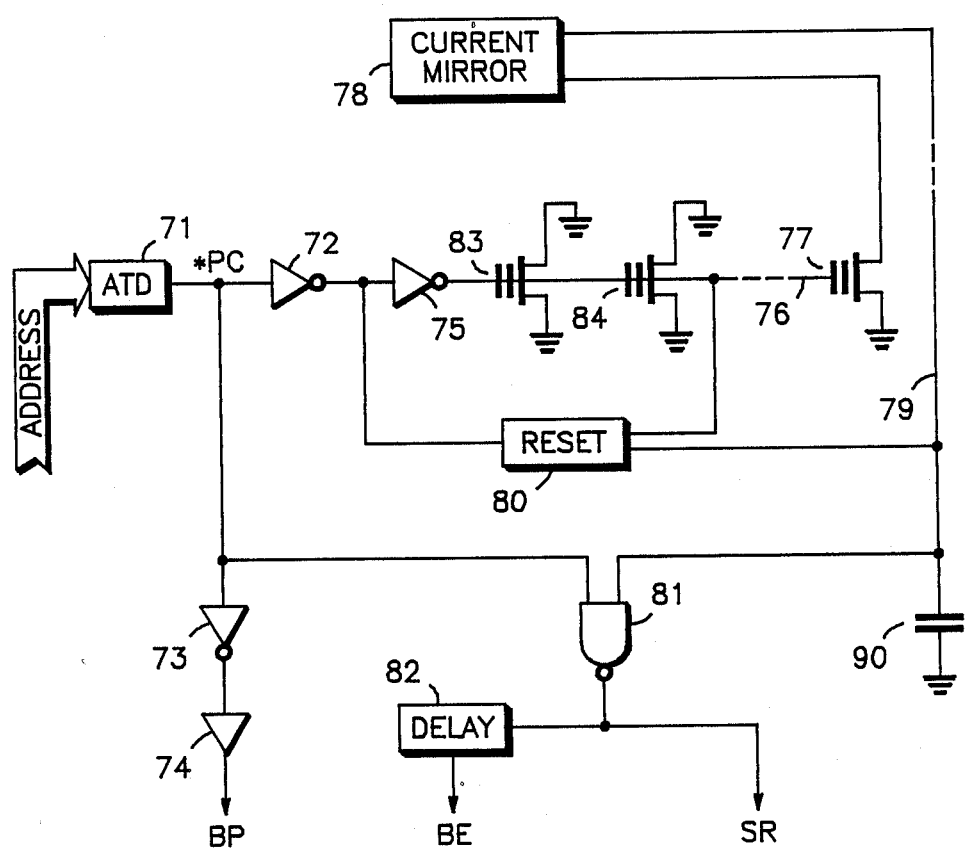
FIG. 6 is a combination block and circuit diagram of a portion of the memory of FIG. 1.

Shown in FIG. 6 is a block diagram of control clock 17. Control clock 17 comprises an address transition detector (ATD) 71, inverters 72, 73, and 75, amplifiers 75, a word line 76, a floating gate transistor 77, a current source 78, a bit line 79, reset circuit 80, a NAND gate 81, and a delay circuit 82. In response to a change in a column or row address transition, ATD 71 generates a signal *PC as a logic low pulse of about 10 ns duration. The asterisk (*) in front of a signal is used to indicate that the signal is active at a logic low. Inverters 72 and 73 each have an input for receiving signal *PC, and each have an output. Inverter 75 has an input coupled to the output of inverter 72, and an output connected to word line 76. Inverter 75 along with inverter 72 comprise the same circuit as used by row decoder 14 for enabling the word line. Word line 76 is made the same way as a line, such as word line 41, in array 12. Floating gate transistor 77 is an unprogrammed floating gate transistor which has a gate connected to word line 76, a drain connected to current source 78, and a source connected to ground. Transistor 77 is connected at the end of word line 76. Word line 76 has a plurality of floating gate transistors connected thereto such as transistors 83 and 84. The total number of floating gate transistors connected thereto is the same as for a word line in array 12 of FIG. 1.

When signal *PC is a logic low the output of inverter 72 is a logic high which activates reset circuit 80 which is connected to the output of inverter 72. When activated, reset circuit 80 resets word line 76 and bit line 79 to ground. Also when signal *PC is a logic low, inverter 73 provides a logic high output to an input of amplifier 74. Amplifier 74 has an input connected to the output of inverter 73, and an output for providing bit line precharge signal BP. Upon receiving the logic high from inverter 73, amplifier 74 switches signal BP from a logic low to a logic high. This causes the bit lines of array 12 to be precharged near ground.

When signal *PC switches back to a logic high, inverter 72 provides a logic low output which deactivates reset circuit 80 and causes inverter 75 to provide a logic high onto word line 76 analogously to row decoder 14 enabling a word line. Word line 76 and the transistors connected thereto such as transistors 83 and 84 simulates the delay in enabling a word line in array 12. The delay in enabling a word line in array 12 will vary with process variations such as polysilicon conductivity, and word line width and depth. These variations are matched with word line 76 so as to match changes in word line delay. Transistor 77 receives the logic high and in response begins drawing current from current mirror 78. There is a delay time from the time that signal *PC first indicates that there has been an address transition by switching to a logic low and transistor 77 being enabled. The delay is the summation of the duration of the logic low of pulse *PC, the delay of inverter 72 and inverter 75, and the propagation delay along word line 76. The delay from an address transition to enabling transistor 77 is the same as from an address transition to row decoder 14 enabling a memory cell at the end of a word line. This is ensured because the circuitry used for the delay in enabling transistor 77 is copied from the circuitry used for enabling a memory cell at the end of a word line.

Floating gate transistor 77 draws a reference current from current mirror 78 which current mirror 78 uses to provide to bit line 79. Because transistor 77 is a floating gate transistor, it draws current analogous to that drawn by a memory cell. Additionally, transistor 77 matches the threshold voltage of a floating gate transistor in the unprogrammed state such as the reference transistors 36 and 37. Consequently, control block 17 includes tracking of threshold voltage variation over process variations as well as environmental variations. Current mirror 78 uses the current drawn through transistor 77 to determine the current supplied to bit line 79 to charge bit line 79 to a voltage which is detected by NAND gate 81. NAND gate 81 has a first input connected to the end of bit line 79, a second input for receiving signal *PC, and an output for providing signal SR. Delay circuit 82 has an input for receiving signal SR and an output for providing signal BE. Bit line 79 is made to have analogous capacitance characteristics to a bit line, such as bit line 38, in array 12. Each bit line 38 in array 12 has connected thereto the drain of floating gate transistors equal in number to the number of word lines. These drains add appreciably to the capacitance of bit line 38. This drain capacitance varies with process. Additionally, this drain capacitance has a unique relationship with voltage. In order to match the behavior of bit lines in array 12, bit line 79 has additional capacitance added thereto which is of the same type as that of floating gate transistor drains. The floating gate drains are N+ regions formed in the substrate in which memory 10 is formed. Accordingly, N+ regions comparable to those of floating gate drains are connected to bit line 79 to form the desired added capacitance. This added capacitance is indicated by a capacitor 90 connected between bit line 79 and ground in FIG. 6. Capacitor 90 thus has comparable characteristics to that of the drain capacitance on bit line 39. Consequently, variations in delay due to variations in drain capacitance on bit line line 39 will cause a similar variation in delay on bit line 79. When bit line 79 reaches sufficient voltage to be recognized as a logic high, NAND gate 81 will output signal SR as a logic low so long as the output of inverter 72 is a logic low. The output of inverter 72 is a logic low except in response to an address transition which cause signal *PC to pulse to a logic low. While signal *PC is a logic low, NAND gate 81 outputs signal SR at logic high and reset circuit 80 resets bit line 79 and word line 76. Prior to signal *PC switching to a logic low, bit line 79 will normally be a logic high so that NAND gate is supplying signal SR at logic low. Upon signal *PC switching to a logic low, signal SR is switched to a logic high and held there for the duration of signal *PC being a logic low. By the time signal *PC as switched back to a logic high, reset circuit 80 has reset bit line 79 to a logic low. Bit line 79 then causes NAND gate 81 to provide signal SR at a logic high until bit line 79 is charged to a logic high by word line 76 being enabled, transistor 77 drawing current from current mirror 78, and current mirror 78 supplying current to bit line 79 to provide the charging current which causes bit line 79 to reach a logic high. Signal SR is thus a logic high from the time an address transition is detected until bit line 79 is charged to a logic high. This time duration from signal *PC switching to a logic low until bit line 79 is charged to a logic high for the time duration of signal SR being a logic high is selected for optimum performance of sense amplifier 11. The elements selected for determining the logic high duration of signal SR were selected to match variations in memory 10 which affected the speed with which data could be sensed. In particular, the bit line variations, the word line variations, and threshold voltage variations of the unprogrammed memory cells have corresponding variations inherently present in control block 17 which determines the duration of signal SR at a logic high.

Signal SR is used to hold the drains of transistors 52 and 45 at ground via transistor 44 until the selected bit line is actually ready to be read. The selected bit line is not ready to be read until the bit line has been charged because transistor 51 supplies the current which charges the selected bit line. When the selected memory cell has the high threshold voltage, the detection mechanism is dependent upon there being relatively little current flowing through transistor 51. During the charging of the selected bit line, however, the current through transistor 51 is not significantly smaller than that through transistor 54 so that signal SO would move to a logic high during the charging of the selected bit line if transistor 44 did not hold it to ground. Signal SO switching to a logic high during the charging of the selected bit line would occur even if the selected memory cell is in the high threshold voltage state. Signal SO is supposed to be a logic low when the selected memory cell is in the high threshold state. If transistor 44 did not hold signal SO to a logic low during the charging of the selected bit line, then there would be a recovery time for signal SO to switch back to a logic low for the case of a selected high threshold voltage memory cell. Of course when the selected memory cell is in the low threshold voltage state, there is a transition time for signal SO to switch from a logic low to a logic high. This transition time is less than there would be for a logic high to logic low transition because transistor 52 has twice the current carrying capability of transistor 45 so that the capacitance at the drains of transistors 45 and 52 is quickly charged. The selected memory cell, even if in high threshold state, may have some leakage current which would be mirrored in transistor 52 and would then work against a logic high to logic low transition of signal SO.

The timing of signal SR is thus very critical because it must be at a logic high long enough to avoid the potential false transition of signal SO while not being a logic high so long as to prevent sense amplifier 11 from performing a sensing operation as soon as the selected bit line is ready. Consequently, great care is taken to ensure that signal SR occurs just as the selected bit line is charged. This is achieved by using the same type circuit elements for control clock 17 as is used in memory 10 in accessing a selected memory cell. By matching the circuit elements, the timing provided by clock 17 varies over process variations in the same way as the other circuitry of memory 10 which controls access time. Consequently, for the case in which the particular process provides a faster access time, clock 17 will also be faster so that signal SR is still provided just as a selected bit line is ready to be read. Clock 17 models the worst case access time which is for a selected memory cell which is at the end of a word line. Because the access time specification is for the worst case condition, there is no harm in inhibiting the access time for the faster locations to match the worst case location.

Figure 7:
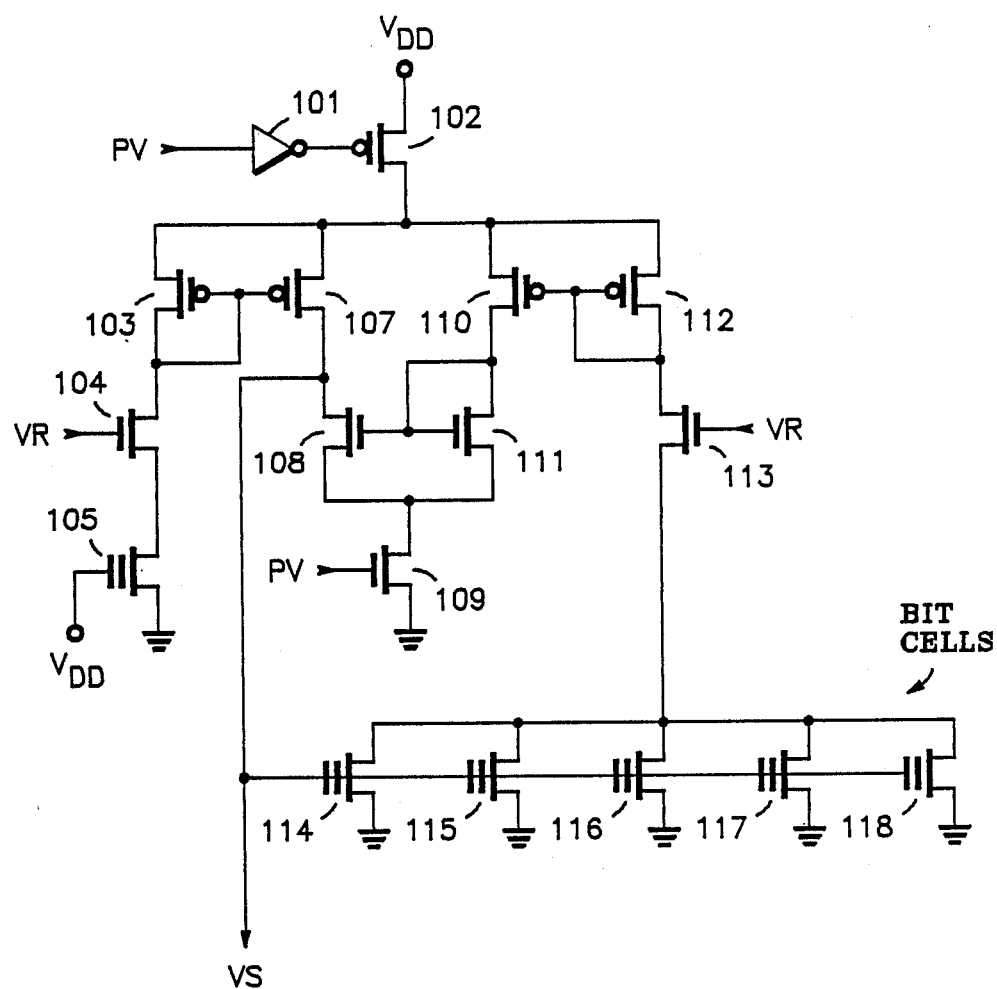
FIG.7 is a circuit diagram of a reference generator for use in the memory of FIG.1.

Shown in FIG. 7 is a circuit diagram of reference generator 68 comprised of N channel transistors 104, 108, 109, 111, and 113; P channel transistors 102, 103, 107, 110, and 112; floating gate transistors 105, 114, 115, 116, 117, and 118; and an inverter 101. Inverter 101 has an input for receiving signal PV, and an output. Transistor 102 has a source connected to VDD, a gate connected to the output of inverter 101, and a drain. Transistor 103 has a source connected to the drain of transistor 102, and a gate and a drain connected together. Transistor 104 has a drain connected to the drain and gate of transistor 103, a gate for receiving reference voltage VR, and a source. Transistor 105 has a drain connected to the source of transistor 104, a gate connected to VDD, and a source connected to ground. Transistor 107 has a source connected to the drain of transistor 102, a gate connected to the gate and drain of transistor 103, and a drain connected to the output of reference generator 68. Transistor 108 has a drain connected to the output of reference generator 68, a gate, and a source. Transistor 109 has a drain connected to the source of transistor 108, a gate for receiving signal PV, and a source connected to ground. Transistor 110 has a source connected to the source of transistor 107, a drain connected to the gate of transistor 108, and a gate. Transistor 111 has a source connected to the drain of transistor 109, a drain and a gate connected to the drain of transistor 110 and the gate of transistor 108. Transistor 112 has a source connected to the source of transistor 110, and a gate and a drain connected together. Transistor 113 has a drain connected to the gate and drain of transistor 112, a gate for receiving reference voltage VR, and a source. Transistors 114-118 each have a drain connected to the source of transistor 113, a gate connected to the output of reference generator 68, and a source connected to ground.

Transistors 104 and 113 are for matching the affect of transistors 26 and 27 shown in FIG. 1. Transistors 102 and 109 are for enabling reference generator 68 in reponse to signal PV being a logic high. Transistors 102 and 109 are relatively high gain so that when signal PV is a logic low, the sources of transistors 108 and 111 are held to ground and the sources of transistors 103, 107, 110, and 112 are held to VDD. When signal PV is at a logic low transistors 102 and 109 are non-conductive.

When signal PV is a logic high, reference generator 68 provides signal VS at a voltage which causes an unprogrammed memory cell to be biased to a current carrying capability of one fifth that of an unprogrammed memory cell biased at VDD, the voltage of an enabled word line. Transistor 105 is a floating gate transistor which draws a current equal to that of an unprogrammed memory cell. The current through transistor 105 is also drawn through transistor 103. The current through transistor 103 is reflected to transistor 107 in conventional current mirror fashion. P channel transistors 103 107, 110, and 112 all have the same gain as each other. N channel transistors 108 and 111 also have the same gain as each other. Floating transistors 114-118 also are constructed the same as memory cells and are unprogrammed. Transistors 114 and 118 are biased by reference signal VS to carry some current.

The current through transistors 114–118 is drawn through transistor 112 where it is mirrored to transistor 110. The current through transistor 110 is the current through transistor 111. The current through transistor 111 is mirrored to transistor 108 to bias transistor 108 to a current carrying capability equal to that of the current through transistors 114–118. Transistor 103 is biased to a current carrying capability equal to the current through transistor 105.

The current through transistors 114–118 is controlled by signal VS which is generated at the drains of transistors 107 and 108. Signal VS will stabilize at a voltage which causes transistor 108 to be biased at to the same current carrying capability as that of transistor 103. When transistors 107 and 108 are biased to the same current carrying capability, the current through transistor 105 will be the same as the current through transistors 114–118. The current through any of transistors 114–115 will be one fifth of the total current through transistors 114–115. Thus signal VS is generated at a voltage which biases an unprogrammed memory cell to a current carrying capability equal to one fifth that of an unprogrammed memory cell which is coupled to an activated word line.

We claim:

1. In a memory having an array of non-volatile memory cells which are in either a programmed or unprogrammed state, wherein a memory cell in the programmed state has a conductivity on one side of a first magnitude and a memory cell in the unprogrammed state has a conductivity on the other side of the first magnitude, a circuit comprising:
    reference means for selectively providing a reference at a conductivity of a second magnitude or a conductivity of a third magnitude;
    sense amplifier means, coupled to the reference means, for determining if a selected cell is in the programmed or unprogrammed state when the reference means provides the reference at a conductivity of the second magnitude and for determining if a selected cell has a conductivity less than a fourth magnitude when said reference means provides the reference at a conductivity of the third magnitude, said fourth magnitude being on said one side of said first magnitude.

2. The memory of claim 1, wherein a conductivity on said one side of the fourth magnitude is characterized as a conductivity less than said second magnitude;
    whereby a cell is programmed when it has a conductivity less than the first magnitude, a cell which is determined to have a conductivity on said one side of the fourth magnitude has a conductivity which is less than the fourth magnitude, and the fourth magnitude is less than the first magnitude.

3. The memory of claim 2 wherein the sense amplifier is further characterized as providing an output signal in a first logic state when the selected cell has a conductivity which is less than the first magnitude if the reference means provides a conductivity of the second magnitude and when the selected cell has a conductivity which is less than the fourth magnitude if the reference means provides a conductivity of the third magnitude.

4. The memory of claim 1 wherein the sense amplifier is further characterized as providing an output signal in a first logic state when the selected cell has a conductivity which is on said one side of the first magnitude if the reference means provides a conductivity of the second magnitude and when the selected cell has a conductivity which is on said one side of the fourth magnitude if the reference means provides a conductivity of the third magnitude.

5. In a memory having an array of non-volatile memory cells which are in either a programmed or an erased state, wherein a memory cell in the programmed state has a conductivity on the side of a first conductivity and a memory cell in the erased state has a conductivity on the other side of the first conductivity, and having a sense amplifier for comparing the conductivity of a selected cell to a reference coupled to the sense amplifier, a circuit comprising:
    decoder means for selecting a memory cell in response to an address and for coupling said selected memory cell to the sense amplifier;
    read means for coupling the reference to the sense amplifier at a conductivity of a first magnitude when a control signal is in a first logic state; and
    program check means for coupling the reference to the sense amplifier at a conductivity of a second magnitude when the control signal is in a second logic state.

* * * * *